(12) United States Patent
Nakanishi et al.

(10) Patent No.: US 7,230,256 B2
(45) Date of Patent: Jun. 12, 2007

(54) ION DOPING SYSTEM, ION DOPING METHOD AND SEMICONDUCTOR DEVICE

(75) Inventors: Ken Nakanishi, Kashihara (JP); Hiroshi Aichi, Matsusaka (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 0 days.

(21) Appl. No.: 10/559,128

(22) PCT Filed: May 31, 2004

(86) PCT No.: PCT/JP2004/007875

§ 371 (c)(1),
(2), (4) Date: Dec. 1, 2005

(87) PCT Pub. No.: WO2004/109784

PCT Pub. Date: Dec. 16, 2004

(65) Prior Publication Data

US 2006/0151786 A1    Jul. 13, 2006

(30) Foreign Application Priority Data

Jun. 4, 2003  (JP) .............................. 2003-158789

(51) Int. Cl.
*H01L 29/04* (2006.01)
(52) U.S. Cl. .................... 250/492.21; 250/492.3; 250/492.1; 250/492.22; 313/361.1; 313/362.1; 315/111.01; 430/30; 257/61
(58) Field of Classification Search .................... None
See application file for complete search history.

(56) References Cited

U.S. PATENT DOCUMENTS 5,560,777 A * 10/1996 Ahn ....................... 118/723 E
6,518,102 B1    2/2003 Tanaka et al.
6,555,831 B1 *  4/2003 Konishi et al. ......... 250/492.21
6,566,257 B2    5/2003 Sueyoshi
7,078,714 B2 *  7/2006 Maeno et al. .......... 250/492.21

FOREIGN PATENT DOCUMENTS

| | | |
|---|---|---|
| JP | 6-333824 A | 12/1994 |
| JP | 6-333825 A | 12/1994 |
| JP | 8-212953 A | 8/1996 |
| JP | 8-227685 A | 9/1996 |

(Continued)

Primary Examiner—Jack Berman
Assistant Examiner—Zia R. Hashmi
(74) Attorney, Agent, or Firm—Birch, Stewart, Kolasch & Birch, LLP (57) ABSTRACT

An ion doping system includes a chamber 11, an exhausting section 13 for exhausting gases from the chamber, an ion source 12 provided for the chamber, and an accelerating section 23 for extracting the ions, generated in the ion source 12, from the ion source 12 and accelerating the ions toward a target. The ion source 12 includes an inlet port 14 to introduce a gas including a dopant element, a filament 15 emitting thermo electrons, and an anode electrode 17 to produce an arc discharge between the filament and itself. The ion source 12 decomposes the gas through the arc discharge, thereby generating ions including the dopant element. The ion doping system controls the arc discharge such that a constant amount of arc current flows between the filament and the anode electrode.

19 Claims, 4 Drawing Sheets

FOREIGN PATENT DOCUMENTS

| | | |
|---|---|---|
| JP | 8-236054 A | 9/1996 |
| JP | 8-236056 A | 9/1996 |
| JP | 8-236471 A | 9/1996 |
| JP | 11-260276 A | 9/1999 |
| JP | 2000-182526 A | 6/2000 |
| JP | 2000-182527 A | 6/2000 |
| JP | 2001-23532 A | 1/2001 |
| JP | 2001-250957 A | 9/2001 |
| JP | 2001-307650 A | 11/2001 |

* cited by examiner

ION DOPING SYSTEM, ION DOPING METHOD AND SEMICONDUCTOR DEVICE

TECHNICAL FIELD

The present invention relates to an ion doping system for implanting ions into a target (i.e., doping the target with the ions). The present invention also relates to a semiconductor device fabricated by using such an ion doping system.

BACKGROUND ART

Recently, to realize a big high-resolution liquid crystal display, a high-speed high-resolution close-contact image sensor, a three-dimensional IC and so on, people have tried to fabricate a high-performance semiconductor component on an insulating substrate of glass, for example.

To make such a semiconductor component, a thin-film semiconductor layer needs to be formed. Thus, techniques of fabricating a semiconductor component on an insulating substrate using either a semiconductor thin film of an amorphous silicon (a-Si) semiconductor or a semiconductor thin film of a crystalline silicon semiconductor such as polysilicon or microcrystalline silicon are known in the art.

The amorphous silicon semiconductor thin film can be formed at a relatively low temperature by a vapor phase process, and therefore, is mass-producible and generally used most commonly. However, the amorphous silicon semiconductor thin film has inferior physical properties in terms of conductivity, for example. That is why if a device of any of those various types requires high-performance semiconductor components, the amorphous silicon semiconductor thin film cannot be used effectively for that purpose.

Meanwhile, the crystalline silicon semiconductor thin film has superior conductivity and has been the object of numerous researches and developments to use the film in those devices. Following methods of making a thin-film crystalline silicon semiconductor are known:

(1) directly form a silicon semiconductor film with crystallinity during its film deposition process;
(2) form an amorphous silicon semiconductor film once and then expose it to intense light, thereby crystallizing the amorphous silicon with its energy; and
(3) form an amorphous silicon semiconductor film once and then apply thermal energy to it, thereby crystallizing the amorphous silicon.

According to the method (1), silicon is crystallized as the film deposition process proceeds. That is why unless the film being deposited is sufficiently thick, crystalline silicon with a large crystal grain size will not be obtained. Consequently, according to this method, it is technically difficult to form a crystalline silicon semiconductor thin film with good semiconductor properties over the entire surface of a substrate with a broad area. On top of that, since the film needs to be deposited at a temperature of 600° C. or more, an inexpensive glass substrate with a low softening point cannot be used as an insulating substrate to raise the manufacturing cost unintentionally.

(2) According to the method (2), a crystallization phenomenon during a melting and solidifying process is utilized, and therefore, high-quality crystalline silicon semiconductor with a small crystal grain size but a well processed grain boundary can be obtained. However, a practical means for irradiating a substrate with a broad area with such intense light is rare to find. For example, when an excimer laser, which is currently used most commonly, is used, the laser beam does not have so good stability as to process the entire surface of a substrate with a broad area uniformly. Thus, it is hard to obtain a crystalline silicon film according to this method, too. Consequently, it is difficult to fabricate a plurality of semiconductor components with uniform characteristics over the same substrate. What is worse, since the laser beam cannot cover the broad area, the productivity is bad.

Compared to the methods (1) and (2), the method (3) is advantageous in that a crystalline silicon semiconductor film can be deposited over a broad area relatively easily. However, to complete the crystallization, a heat treatment must be conducted at as high a temperature as 600° C. or more for several tens of hours. Accordingly, if the heating temperature is lowered to use an inexpensive glass substrate, the heat treatment needs to be carried out for even a longer time, thus decreasing the throughput. Also, since a solid phase crystallization phenomenon is utilized according to this method, the crystal grains will grow parallel to the substrate plane and their crystal grain sizes may sometimes reach several μm. However, since a grain boundary is formed as a result of contact between grown crystal grains, the grain boundary serves as a trap level against carriers, which may cause a decrease in electron mobility.

Among these three methods, people are paying particularly much attention to the method (3) as one of most promising methods. Thus, a method of forming a high-quality, highly uniform crystalline silicon film by carrying out a heat treatment at a low temperature and in a short time by utilizing the method (3) is disclosed in Japanese Patent Application Laid-Open Publications Nos. 6-333824, 6-333825 and 8-330602, for example.

According to the method disclosed in these patent documents, it would be possible to complete the crystallization at as low a temperature as 600° C. or less and in a processing time of about a few hours by thermally treating an amorphous silicon film with a very small amount of nickel or any other metallic element introduced through the surface of the amorphous silicon film.

In this method, first, nuclei of crystals are generated from the introduced metallic element at an early stage of the heat treatment process, and then the metallic element functions as a catalyst for promoting the crystal growth of silicon, thus advancing the crystallization rapidly. That is why the metallic element introduced is called a "catalyst element". A silicon film that has been crystallized by a normal solid phase growth process has a twin crystal structure, whereas a crystalline silicon film, obtained by this method, consists of a great many columnar crystals. And the inside of each of those columnar crystals almost has a single crystal state.

According to this method, however, if the catalyst element remained in the silicon film, then normal semiconductor component characteristics would not be achieved. For that reason, as disclosed in Japanese Patent Application Laid-Open Publication No. 6-333824 or No. 8-236471, the catalyst element is trapped using phosphorus ions, for example. More specifically, after a crystalline silicon film, obtained by a heat treatment using a catalyst element introduced, has been patterned, a gate insulating film is deposited on the surface of the crystalline silicon film and then a gate electrode is formed thereon. Then, the patterned crystalline silicon film is doped with phosphorus ions using the gate electrode as a mask. As a result, portions of the crystalline silicon film (i.e., source/drain regions), except the region right under the gate electrode, are doped with phosphorus. Thereafter, the phosphorus ions introduced are activated with either thermal energy or laser light. As a result, the catalyst element that has been located in the region right under the gate electrode are trapped (i.e., gettered) in the source/drain regions, and a thin-film transistor, using the region right under the gate electrode as a channel region, can be obtained.

The phosphorus ion doping process needs to be carried out on a crystalline silicon film with a broad area. For that purpose, an ion beam system that can emit an ion beam with a large cross section is used. To generate a lot of ions and to form an ion beam with a broad cross section, such an ion beam system uses diborane and phosphine as source gases, generates an ion beam by getting these gases decomposed by an ion source, and then irradiates a crystalline silicon film with that ion beam without passing the beam through a mass separator. In this case, the conventional ion beam system is controlled such that the ion beam has a constant beam current density and the crystalline silicon film is doped with the ions.

When such a control is carried out, however, the quantity of charge per unit area of the doping ions becomes constant but the species of the ions generated is variable. The properties of a semiconductor doped change according to the ion species. That is why if semiconductor components are fabricated by getting a crystalline silicon film doped with ions by a conventional ion beam system, then the characteristics of the semiconductor components will vary significantly. In addition, due to such a significant variation in characteristics, the yield of semiconductor devices that satisfy a predetermined standard decreases, too.

DISCLOSURE OF INVENTION

In order to overcome the problems described above, an object of the present invention is to provide an ion doping system and ion doping method, in which the ratio of ion species generated varies to a much lesser degree. The present invention also relates to a semiconductor device, fabricated by using such an ion doping system, and a method for fabricating such a semiconductor device.

An ion doping system according to the present invention includes: a chamber; an exhausting section for exhausting gases from the chamber; an ion source, which is provided for the chamber, includes an inlet port to introduce a gas including a dopant element, a filament emitting thermo electrons, and an anode electrode to produce an arc discharge between the filament and itself, and decomposes the gas through the arc discharge, thereby generating ions including the dopant element; and an accelerating section for extracting the ions, generated in the ion source, from the ion source and accelerating the ions toward a target. The ion doping system controls the arc discharge such that a constant amount of arc current flows between the filament and the anode electrode.

In one preferred embodiment, the ion doping system further includes: a filament power supply for applying a voltage to the filament; and an arc power supply for applying a voltage between the filament and the anode electrode. The ion doping system controls the filament power supply and/or the arc power supply such that a constant amount of arc current flows between the filament and the anode electrode.

In another preferred embodiment, the ion doping system further includes an ammeter for measuring the arc current and controls the output voltage of the arc power supply such that the arc current measured with the ammeter has a constant value.

In still another preferred embodiment, a plurality of ions species are produced at a constant ratio from the gas as a result of the arc discharge.

A semiconductor device according to the present invention includes: a substrate with an insulating surface; and a crystalline silicon film provided on the substrate. The semiconductor device includes a plurality of semiconductor components, in each of which source, drain and channel regions are defined in the crystalline silicon film by introducing the dopant element as an impurity into the crystalline silicon film using an ion doping system according to any of the preferred embodiments described above.

In one preferred embodiment, the semiconductor device satisfies the inequality $0.05 \geqq 3\sigma/\mathrm{Ave}$, where Ave is the average of dopant concentrations in the respective channel regions of the semiconductor components and $\sigma$ is the standard deviation thereof.

In an alternative preferred embodiment, the semiconductor device satisfies the inequality $0.05 \geqq 3\sigma/\mathrm{Ave}$, where Ave is the average of dopant concentrations in the respective source/drain regions of the semiconductor components and $\sigma$ is the standard deviation thereof.

In another preferred embodiment, the crystalline silicon film has been crystallized with a catalyst element that promotes the degree of crystallinity of an amorphous silicon film.

In this particular preferred embodiment, the amorphous silicon film has a thickness of 25 nm to 80 nm.

In another preferred embodiment, the crystalline silicon film has the catalyst element at a concentration of $1 \times 10^{16}$ atoms/cm$^3$ or less.

In still another preferred embodiment, the catalyst element is at least one element selected from the group consisting of nickel, cobalt, palladium, platinum, copper, silver, gold, indium, tin, aluminum and antimony.

In a specific preferred embodiment, the catalyst element is nickel.

In yet another preferred embodiment, the crystalline silicon film has been formed by carrying out at least one of a furnace heating process, a lamp annealing process and a laser radiation process after the catalyst element has been introduced.

An ion doping method according to the present invention includes the steps of: decomposing a gas, including a dopant element, through an arc discharge; and accelerating ions, which have been produced as a result of the step of decomposing, with a predetermined voltage, thereby bombarding a target with the ions. The step of decomposing includes controlling the arc discharge such that a constant amount of current is produced by the arc discharge.

In one preferred embodiment, the dopant element is boron or phosphorus.

A method for fabricating a semiconductor device according to the present invention includes the steps of: (A) forming an amorphous silicon film on a substrate with an insulating surface; (B) adding a catalyst element to the amorphous silicon film; (C) thermally treating and crystallizing the amorphous silicon film, to which the catalyst element has been added, thereby turning the amorphous silicon film into a crystalline silicon film; (D) generating an arc discharge that produces a constant amount of arc current, thereby decomposing a gas including an impurity element and accelerating, and introducing into the crystalline silicon film, ions that have been generated as a result of the decomposition; and (E) thermally treating the crystalline silicon film.

In one preferred embodiment, the method further includes the step of forming an insulating film on the crystalline silicon film after the step (C) has been performed. The step (D) includes the steps of: (D1) generating the arc discharge that produces the constant amount of arc current, thereby decomposing the gas including the impurity element and accelerating, and introducing into the crystalline silicon film by way of the insulating film, the ions that have been generated as a result of the decomposition; (D2) making a pattern of a conductive material on the crystalline silicon film; and (D2) generating the arc discharge that produces the constant amount of arc current, thereby decomposing the gas including the impurity element and accelerating, and introducing into the crystalline silicon film using the pattern as a mask, the ions that have been generated as a result of the decomposition.

In one preferred embodiment, the impurity element in the step (D1) is boron and the impurity element in the step (D2) is phosphorus.

In another preferred embodiment, the catalyst element is at least one element selected from the group consisting of nickel, cobalt, palladium, platinum, copper, silver, gold, indium, tin, aluminum and antimony.

BEST MODE FOR CARRYING OUT THE INVENTION

Figure 1:
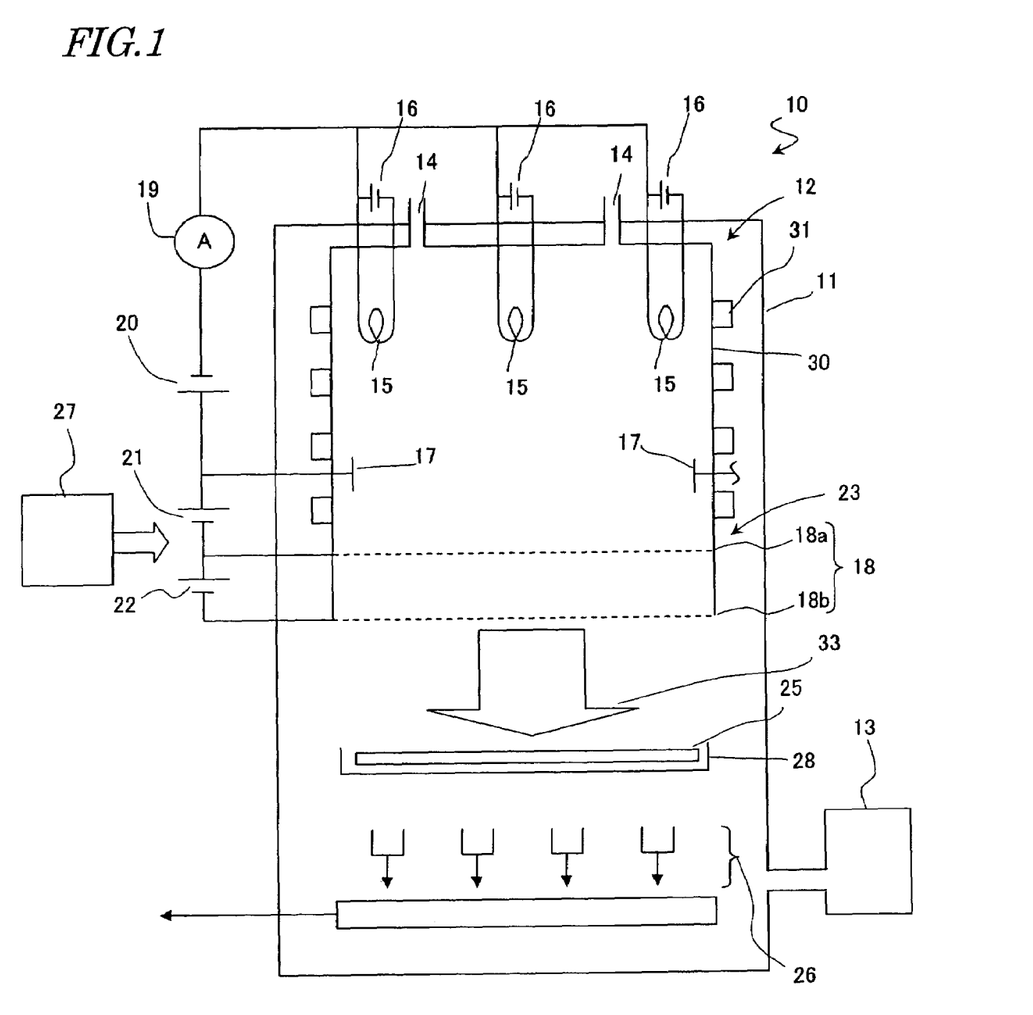
FIG. 1 is a schematic representation illustrating a preferred embodiment of an ion doping system according to the present invention.

FIG. 1 illustrates a preferred embodiment of an ion doping system according to the present invention. The ion doping system 10 shown in FIG. 1 includes a chamber 11, an exhausting section 13, an ion source 12 and an accelerating section 23.

The exhausting section 13 may be implemented as a known pump, for example, and can exhaust gases from the chamber 11 and maintain an appropriate pressure within the chamber. Although not shown, a disinfecting system for removing poisons from various gases used in the ion doping system is connected to the exhausting section 13.

The ion source 12 decomposes a gas including a dopant element through an arc discharge, thereby generating plasma and ions including the dopant element. The ion source 12 is arranged within the chamber 11 and includes an arc chamber 30, gas inlet ports 14, and filaments 15. The gas inlet ports 14 are provided for the arc chamber 30 to introduce a gas including the dopant element into the arc chamber 30 of the ion source 12. The filaments 15 are arranged on the ceiling of the arc chamber 30. In FIG. 1, three filaments 15 are shown. However, any other appropriate number of filaments may be arranged elsewhere according to the shape of the arc chamber 30 and the shape and size of an ion beam required. An anode electrode 17 is provided on the side surface of the arc chamber 30. Around the arc chamber 30, arranged are ring magnets 31 for confining the generated plasma in the arc chamber 30.

A filament power supply 16 is connected to each of the filaments 15. The ion doping system 10 includes a controller 27 such as a microcomputer for controlling the output voltages of the filament power supplies 16 and the amount of currents flowing through the filaments 15.

Also, an arc power supply 20 is connected between the filaments 15 and the arc electrode 17. An ammeter 19 is preferably provided between the filaments 15 and the arc power supply 20. The value measured by the ammeter 19 is input to the controller 27. The arc power supply 20 is also controlled by the controller 27.

The accelerating section 23 extracts the ions, generated by the ion source 12, from the ion source 12 and accelerates those ions toward a target. The ions generated by the ion source 12 are all accelerated by the accelerating section 23 without being separated by any mass separator. For that purpose, the accelerating section 23 includes extracting electrodes 18, an extracting power supply 21 and an accelerating power supply 22. The extracting electrodes 18 include a first extracting electrode 18a and a second extracting electrode 18b and are arranged at the opening of the arc chamber 30. The first extracting electrode 18a is located closest to the opening of the arc chamber 30 and the extracting power supply 21 is connected between the first extracting electrode 18a and the arc electrode 17. Also, the accelerating power supply 22 is connected between the first and second extracting electrodes 18a and 18b.

A substrate 25, i.e., the target into which the ions should be introduced, is held by a substrate holder 28 so as to face the opening of the arc chamber 30 with the extracting electrodes 18 interposed between them. If the ion beam 33 emitted from the ion source 12 cannot irradiate the substrate 25 at a time due to its shape, then a mechanism for shifting the substrate 25 such that the ion beam 33 can scan the substrate 25 may be provided. A beam current meter 26 is provided under the substrate 25 so as to measure the current produced by the ion beam 33.

Hereinafter, the operation of the ion doping system 10 and an ion doping process using the ion doping system 10 will be described. First, the substrate 25 is fixed with the substrate holder 28 at such a position in the chamber 11 as to be irradiated with the ion beam 33. Thereafter, the chamber 11 is evacuated until a predetermined degree of vacuum is created. A semiconductor film, to which dopant ions should be introduced, may have been deposited on the surface of the substrate 25, for example.

Next, a gas including an element to be dopant ions is introduced through the gas inlet ports 14. For example, in introducing phosphorus as n-type dopant ions into a silicon semiconductor as a target, phosphine ($PH_3$) is used. On the other hand, in introducing boron as p-type dopant ions into the target, diborane ($B_2H_6$) is used. As a result, the arc chamber 30 is filled with a low-pressure gas including an element to be dopant ions.

The filament power supplies 16 apply a predetermined voltage to the filaments 15, thereby supplying the filaments 15 with current. And the arc power supply 20 applies another predetermined voltage between the filaments 15 and the arc electrode 17. Then, thermo electrons, heated by the filaments 15, are emitted from the filaments 15 into the arc chamber 30 to reach the arc electrode 17. These electrons emitted produce an arc discharge. The emitted thermo electrons collide against the phosphine or diborane molecules in the arc chamber 30, thereby decomposing and ionizing these molecules. As a result, plasma is generated.

The controller 27 of the ion doping system 10 controls the arc discharge such that a constant amount of arc current flows between the filaments 15 and the arc electrode 17. More particularly, the controller 27 controls the filament power supply 20 and the arc power supply 21 according to the value of current measured by the ammeter 19 to make the amount of arc current flowing constant. As a result, the amount of current flowing through the filaments 15 and/or the arc voltage between the filaments 15 and the arc electrode 17 are regulated and the quantity of thermo electrons emitted from the filaments per unit time can be kept constant. That is to say, the same quantity of thermo electrons are supplied with respect to the gas that is introduced at a constant rate through the gas inlet ports 14. As a result, the gas decomposition can maintain a constant state and the ratio of ion species generated becomes constant, too.

The cations in the generated plasma are extracted through the opening of the arc chamber 30 responsive to the voltage that has been applied by the extracting power supply 21 between the arc electrode 17 and the first extracting electrode 18a. The extracted cations are accelerated due to the voltage applied by the accelerating power supply 22 between the first and second extracting electrodes 18a and 18b. Then, the accelerated cations impinge as the ion beam 33 onto the substrate 25. The charge carried by the ion beam 33 is measured by the beam current meter 26, thereby obtaining the current or the current density of the ion beam 33.

Figure 2:
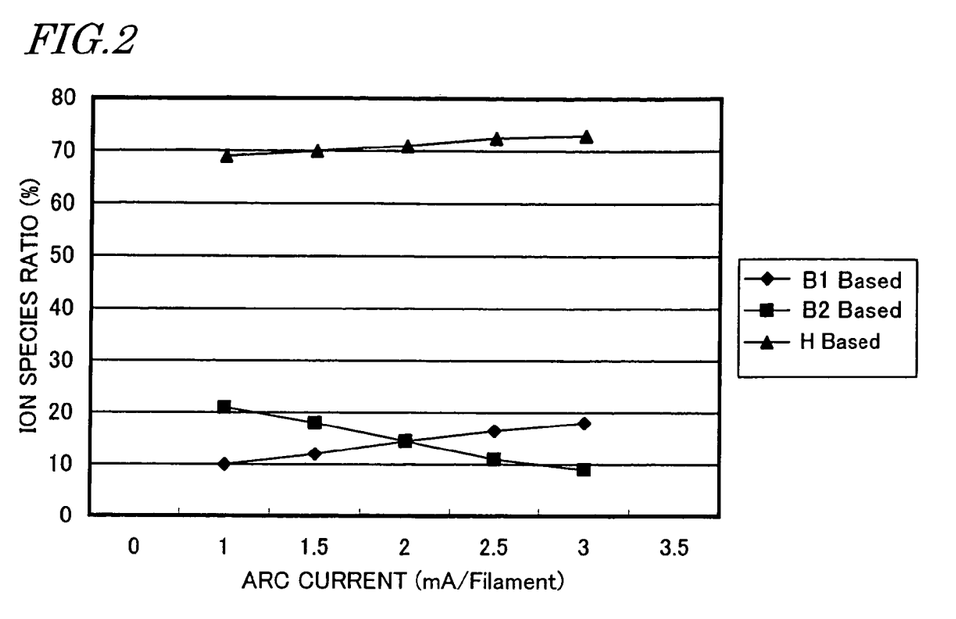
FIG. 2 is a graph showing how the ratio of ion species changes with the arc current.

FIG. 2 shows how the ratio of respective ion species generated changes with the amount of arc current in a situation where diborane is decomposed by using the ion doping system 10. The abscissa represents the amount of arc current per filament, while the ordinate represents the ratio of generated ion species in percentages. In FIG. 2, "B1 based" refers to a chemical species including a single boron atom (such as $BH^+$ and $BH_2^+$), "B2 based" refers to a chemical species including two boron atoms (such as $B_2H^+$ and $B_2H_2^+$), and "H based" refers to a chemical species including only hydrogen atom(s) (such as $H^+$ and $H_2^+$). As is clear from FIG. 2, as the amount of arc current increases, the "B1 based" and "H based" chemical species increase and the "B2 based" chemical species decreases. In other words, as the amount of arc current changes, the ratio of these ion species generated varies, too.

Accordingly, if the ion doping process is controlled so as to make the ion beam current density constant as in the conventional ion doping system, then the amount of arc current changes and the ratio of ion species generated also varies. This means that even if the ion doping process is carried out while being controlled to make the ion beam current density constant, the ratio of generated ion species still varies and the implant dose of the dopant ions changes, too. For example, even if the ion beam current density remains the same but if the amount of arc current per filament has changed from 1 mA into 2 mA, then the implant dose of boron decreases by a factor of 0.84(=(14×2+14)/(20×2+10)). Also, if the ratio of ion species generated changes during the ion doping process, the distribution of the ion species in the arc chamber changes, too, thus making the distribution of the ion species in the ion beam non-uniform. Consequently, if the target is doped with ions with the ion beam current density set constant, the dopant ions will have a non-uniform in-plane distribution.

In contrast, if the target is doped with ions with the amount of arc current set constant by using the ion doping system of the present invention, the ratio of ion species generated can be kept constant. As a result, the distribution of the ion species in the arc chamber can also be kept constant and the ion species are distributed uniformly in the ion beam. Consequently, if the target is doped with ions with the amount of arc current set constant, the dopant ions will have a uniform in-plane distribution.

It should be noted that if the arc discharge is controlled so as to make the amount of arc current constant, then the beam current density of the resultant ion beam changes. However, the present inventors discovered and confirmed via experiments that the variation in beam current density was small enough to match the overall doses by adjusting the implantation process times. As a result, although the implantation process time may change to a certain degree, the ratio of the ion species implanted into the target can be kept constant and the ions species introduced into the target will have a higher degree of in-plane uniformity.

Consequently, if dopant ions are implanted into a crystalline silicon film for a liquid crystal display with the amount of arc current set constant by using the ion doping system of the present invention, then variations in threshold voltage and in semiconductor property such as a source-drain resistance can be minimized among a plurality of thin-film transistors fabricated on a substrate plane.

Hereinafter, it will be described how to fabricate a semiconductor device using the ion doping system of the present invention. In the following description, it will be described how to make an active-matrix substrate for an LCD by fabricating a huge number of n-channel TFTs (thin-film transistors) as pixel switching elements on a glass substrate. Several hundreds of thousands of to a few million TFTs are usually fabricated on the same substrate and should have uniform characteristics. The ion doping system of the present invention can be used effectively to make such an active-matrix substrate for an LCD. If necessary, not just those pixel switching elements but also the elements forming the driver or thin-film integrated circuit of the active-matrix substrate may also be fabricated efficiently by using the ion doping system of the present invention.

FIGS. 3(a) through 3(e) show respective manufacturing process steps of fabricating a semiconductor device according to the present invention, including a great many n-channel TFTs, in the order in which those process steps are carried out. Although at least several hundreds of thousands of TFTs are actually fabricated, it will be described how to fabricate just one of them.

Figure 3:
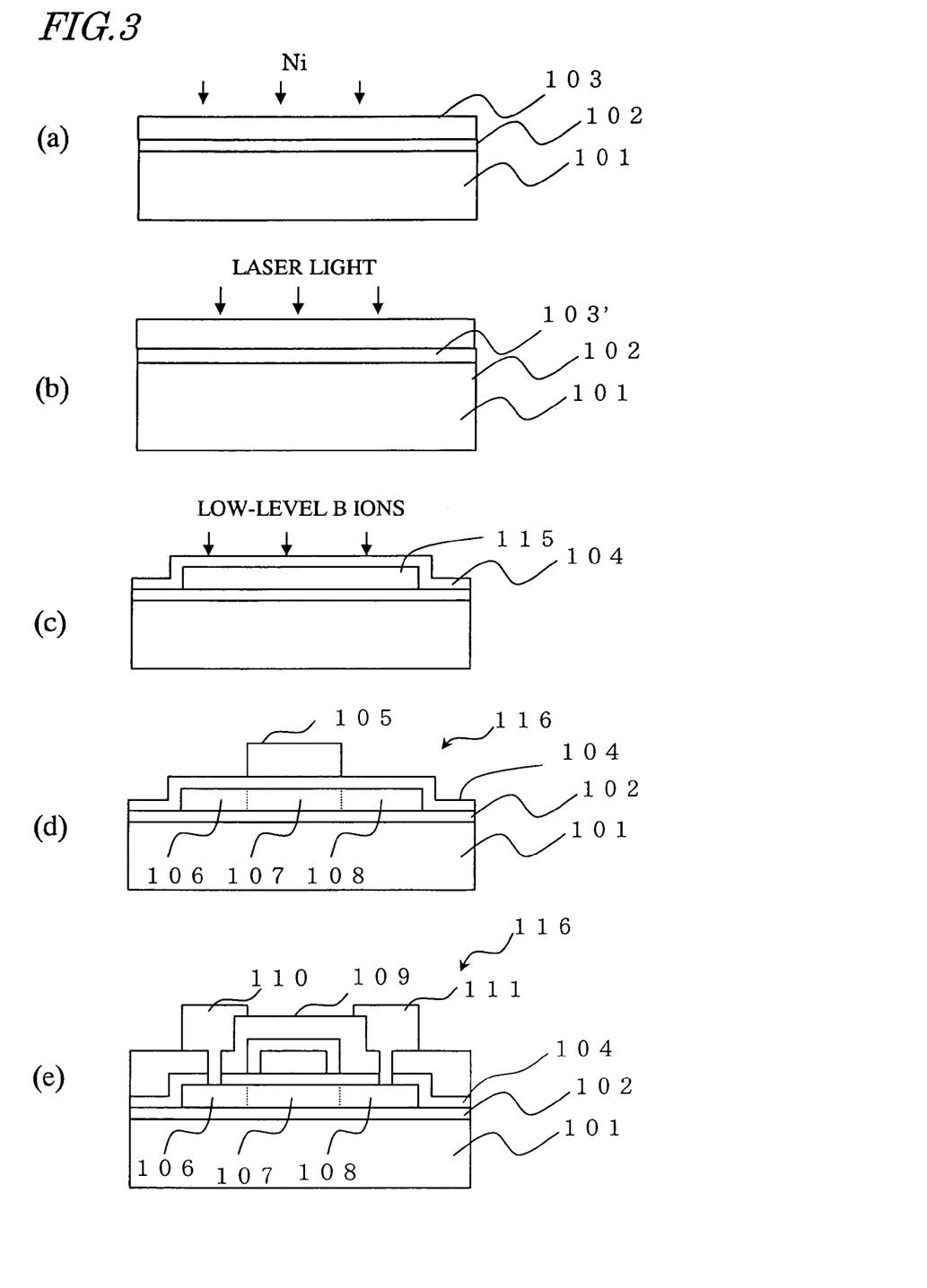
FIGS. 3(a) through 3(e) are schematic cross-sectional views illustrating respective process steps for fabricating a semiconductor device according to the present invention.

First, as shown in FIG. 3(a), an undercoat film 102 of silicon dioxide is deposited by a plasma CVD process to a thickness of 1 nm to 20 nm on an insulating substrate 101 made of glass, for example. Next, an intrinsic amorphous silicon film 103 is deposited thereon to a thickness of 25 nm to 80 nm (e.g., 40 nm) by a plasma CVD process.

Subsequently, Ni is added as a catalyst element to the intrinsic amorphous silicon film 103 by a sputtering process so as to have a surface density of $1 \times 10^{13}$ atoms/cm$^2$ to $1 \times 10^{15}$ atoms/cm$^2$ (e.g., $7 \times 10^{13}$ atoms/cm$^2$). Thereafter, the substrate 101 is subjected to a heat treatment at a temperature of 540° C. to 620° C. for several hours within an inert atmosphere by using a heat treatment furnace or a lamp annealing furnace, for example. As a result of this heat treatment, the crystallization of the intrinsic amorphous silicon film 103 proceeds. In this preferred embodiment, the heat treatment is carried out at 580° C. for an hour within a nitrogen atmosphere by using a heat treatment furnace. Ni does not have to be added by the sputtering process. Alternatively, the intrinsic amorphous silicon film 103 may be coated with a coating solution including a Ni compound, which may then be thermally treated to diffuse Ni from the coating into the intrinsic amorphous silicon film 103 and promote the crystallization of the intrinsic amorphous silicon. Examples of preferred catalyst elements other than Ni include cobalt, palladium, platinum, copper, silver, gold, indium, tin, aluminum and antimony. Optionally, a plurality of metals selected from this group may be used in combination.

Next, as shown in FIG. 3(b), the amorphous silicon film is crystallized by being exposed to a laser beam. As the laser beam, a KrF excimer laser beam with a wavelength of 248 nm and a pulse width of 20 nsec may be used. Alternatively, a laser beam with any other wavelength may also be used. In any case, the laser beam is radiated at an energy density of 200 mJ/cm$^2$ to 400 mJ/cm$^2$ (e.g., at 250 mJ/cm$^2$) and one location is shot with the laser beam twice to ten times (e.g., twice). Optionally, in radiating the laser beam, the substrate may be heated to a temperature of about 200° C. to about 450° C. By heating the substrate during the laser beam radiation process in this manner, the crystallization of the amorphous silicon can be promoted even more efficiently.

During these two-stage heat treatment processes, the catalyst element turns into a silicide, thereby promoting the crystallization of the amorphous silicon film. Among other things, the crystal structure of NiSi$_2$, which is a silicide compound of nickel, is closest to that of single crystalline silicon than the silicide compound of any other catalyst element. And its lattice constant is also very close to that of crystalline silicon. Accordingly, NiSi$_2$ functions as the best mold to crystallize the amorphous silicon film and does promote the crystallization of the amorphous silicon film. In this process step, by setting the thickness of the amorphous silicon film 103 equal to or greater than 25 nm, sufficient crystal growth is realized. And by setting the thickness equal to or smaller than 80 nm, it is possible to prevent crystals from growing in two or more layers in the thickness direction. As a result, the degraded crystallinity, residual catalyst element and other problems can be avoided, and a high-quality crystalline silicon film 103' with a high electron mobility can be made from the amorphous silicon film 103. The heat treatment for the purpose of crystallization may be carried out in a single stage. However, it is more preferable to combine the heat treatment using a heat treatment furnace or a lamp annealing furnace with the heat treatment using a laser radiation. By performing the heat treatments in these two stages, the transistor characteristics of the resultant TFTs will improve significantly.

Thereafter, as shown in FIG. 3(c), excessive portions of the crystalline silicon film 103' are removed to electrically isolate the respective elements from each other and define island-like element forming areas, each including the source, drain and channel regions of a thin-film transistor. On the overall substrate 101, a huge number of element forming areas 115 are arranged in matrix.

Next, as shown in FIG. 3(c), a silicon dioxide film 104 is deposited as a gate insulating film to a thickness of 50 nm to 250 nm (e.g., 150 nm) by a plasma CVD process and then boron ions are implanted into the element forming area 115 through the silicon dioxide film 104 by using the ion doping system 101 shown in FIG. 1. In this preferred embodiment, the ion doping system 101 includes four filaments 15, and the doping process is carried out with the amount of arc current flowing through each filament maintained at a constant value between 1.5 mA and 2.5 mA. For example, the ion doping system 101 may be controlled such that an arc current of 2.0 mA flows per filament and boron ions may be implanted at a dose of $5\times10^{11}$ cm$^{-2}$ to $5\times10^{13}$ cm$^{-2}$ into the element forming area 115. Diborane may be used as the source of boron.

Subsequently, as shown in FIG. 3(d), tantalum nitride (TaN) and tungsten (W) are deposited to a thickness of 10 nm to 100 nm (e.g., 60 nm) and to a thickness of 100 nm to 500 nm (e.g., 300 nm), respectively, by a sputtering process. And by patterning these films deposited, a gate electrode of TaN/W is formed.

Thereafter, phosphorus ions are implanted into the element forming area 115 by using the ion doping system 101 and using the gate electrode 105 as a mask. Phosphine (PH$_3$) may be used as the doping gas, the accelerating voltage may be 60 kV to 90 kV (e.g., 80 kV) and the implant dose may be $1\times10^{15}$ cm$^{-2}$ to $8\times10^{15}$ cm$^{-2}$ (e.g., $2\times10^{15}$ cm$^{-2}$). The ion doping system 101 is controlled such that the amount of arc current flowing becomes a constant value falling within the range of 400 mA to 500 mA (e.g., 450 mA) while the phosphorus ions are being implanted.

After the phosphorus ions have been implanted, the substrate is thermally treated at 550° C. for four hours within a nitrogen atmosphere, thereby activating the dopant introduced. In the meantime, nickel atoms in a portion of the element forming area 115 under the gate electrode 105 (i.e., a region to be a channel region 107) are trapped by the phosphorus atoms in portions of the element forming area 115 that have been doped with phosphorus ions (i.e., regions to be source/drain regions 106, 108). As a result, the concentration of nickel in that region under the gate electrode 105 decreases to about $1\times10^{16}$ atoms/cm$^3$.

In this manner, a p-type channel region 107 is defined in that portion of the element forming area 115 under the gate electrode 105 and n-type source/drain regions 106 and 108 are defined in the element forming area 115 so as to interpose the channel region 107 between them as shown in FIG. 3(d). That is to say, an n-channel TFT 116, including the gate electrode 105, channel region 107, and source/drain regions 106 and 108, is completed. Since the concentration of nickel in the channel region 107 is $1\times10^{16}$ atoms/cm$^3$ or less as described above, the TFT 116 has a small amount of leakage current and high crystallinity in its channel region 107 and therefore has a large amount of ON-state current.

In making a complementary circuit including n-channel and p-channel TFTs, the crystalline silicon film 103' may be selectively doped with boron and phosphorus through appropriate masks such that n-type and p-type regions are defined separately and that an n-channel TFT and a p-channel TFT are formed on the same substrate.

Next, as shown in FIG. 3(e), a silicon dioxide film 109 is deposited to a thickness of 600 nm as an interlayer dielectric film by a plasma CVD process, and contact holes are opened through the silicon dioxide film. One of them is filled with a multilayer film of metals (e.g., titanium nitride and aluminum) to form an electrode 110 for the thin-film transistor and another hole is filled with ITO to make a pixel electrode 111. Finally, a heat treatment is conducted at 350° C. for 30 minutes within a hydrogen atmosphere at 1 atmospheric pressure, thereby completing a semiconductor device including a plurality of TFTs 116.

The following Table 1 shows variations in TFT characteristics on an active-matrix substrate that was made by the method described above and on an active-matrix substrate that was made by the manufacturing process described above except that boron and/or phosphorus were implanted by a conventional control technique that sets the amount of ion beam current constant. As the variations in TFT characteristics, variations in threshold voltage were calculated and are shown in percentages, and the averages (Ave) and standard deviations (σ) of the source-drain resistance within the substrate plane were calculated and 3σ/Ave are shown in percentages. The percentages of resultant active-matrix substrates, of which the variations in TFT characteristics satisfied predetermined criteria, are also shown. The active-matrix substrates had dimensions of 60 mm×80 mm and included one million TFTs.

TABLE 1

| | Control method | | Characteristics (variation) | | |
|---|---|---|---|---|---|
| Sample No. | Boron doping (channel) | Phosphorus doping (source/drain) | Threshold voltage | Source-drain resistance 3 σ/Ave | Yield |
| 1 | Arc current control | Arc current control | 3.8% | 3.4% | 98% |
| 2 | Arc current control | Beam current control | 3.9% | 6.8% | 94% |
| 3 | Beam current control | Arc current control | 7.3% | 3.5% | 92% |
| 4 | Beam current control | Beam current control | 7.4% | 6.7% | 80% |

As is clear from the results of Sample No. 1 shown in Table 1, if the ion doping system was controlled such that the amount of arc current flowing became constant both when boron was implanted and when phosphorus was implanted, the variation in threshold voltage and the variation (3σ/Ave) in source-drain resistance within the substrate plane were as small as less than 5% and the yield of substrates was as high as 98%. The present inventors discovered via intensive experiments that by using the ion doping system of the present invention, the variation in dopant concentration (i.e., 3σ/Ave when the average (Ave) and standard deviation (σ) of the dopant concentration were calculated) could be reduced to less than 5% with respect to an area of 1,000 mm×1,000 mm.

On the other hand, if the ion doping system was controlled as in the conventional process (i.e., such that the amount of beam current flowing became constant) when boron or phosphorus was implanted, the variation in threshold voltage or the variation in source-drain resistance increased to about 7% and the yield decreased. Among other things, if these implantation processes were both carried out by controlling the system by the conventional method to make the amount of beam current constant, the variation in threshold voltage and the variation in source-drain resistance both increased. As a result, the yield dropped to 80%.

Thus, according to this preferred embodiment, when a dopant is introduced into a semiconductor film using an ion doping system, the ion doping system is controlled such that the arc current of arc discharge to generate plasma at an ion source flows in a constant amount. As a result, the ratio of ion species generated at the ion source becomes constant and the ion doping process can be controlled precisely.

Particularly when a TFT is fabricated by using a crystalline silicon film, which is obtained by crystallizing an amorphous silicon film with a catalyst element added, the doping level of phosphorus ions introduced into the source/drain regions has a significant effect on the characteristic of the resultant TFT. More specifically, if the doping level of the phosphorus ions is lower than its setting, then the carrier density decreases and the source-drain resistance increases. In addition, since the concentration of phosphorus will not be high enough to trap the catalyst element that promotes the crystallization of amorphous silicon, the catalyst element will remain a lot in the channel region, the amount of leakage current will increase and other TFT characteristics will deteriorate. As a result, the TFT may cause a failure during its operation. On the other hand, if the doping level of phosphorus ions is higher than its setting, then the phosphorus ions will be implanted excessively to destroy the crystal structure of crystallized silicon and amorphize the crystallized silicon. Consequently, the source-drain resistance rises.

The ion doping system of the present invention can keep the ratio of the ion species generated quite constant during the ion doping process as described above. Thus, the ion species implanted can have a uniform distribution over the entire substrate and the ratio of the ion species generated can be kept constant during the ion doping process. That is why by getting phosphorus ions doped by using the ion doping system of the present invention and getting the implant dose measured by a beam current meter, the implant dose of the phosphorus ions can be controlled precisely and a TFT can be fabricated by using a crystalline silicon film obtained by crystallizing an amorphous silicon film with a catalyst element.

In addition, since the ratio of the ion species can be kept constant during the ion doping process, the ion species are also distributed uniformly in the ion beam and the ions implanted will have an increased degree of in-plane uniformity. As a result, in the semiconductor device of the present invention, the ratio and the doses of the dopant ions introduced into the semiconductor film can be made uniform and the variations in characteristics among a plurality of semiconductor components can be reduced.

In the preferred embodiment described above, in fabricating a TFT using a crystalline silicon film that has been obtained by crystallizing an amorphous silicon film with a catalyst element, boron and phosphorus are implanted to define a channel and source/drain regions, respectively, by using the ion doping system of the present invention. However, the ion doping system of the present invention may also be used in a doping process step to fabricate a semiconductor device of a different type. For example, if TFTs on an active-matrix substrate have an LDD structure, the ion doping system of the present invention may be used in a doping process step to define the LDD structure. As another alternative, the ion doping system of the present invention may also be used to fabricate various types of semiconductor devices on a single crystalline semiconductor substrate.

Also, in the ion doping system shown in FIG. 1, the accelerating section 23 is made up of two electrodes. However, the number of electrodes to provide does not have to be two. For example, in an alternative ion doping system 10' shown in FIG. 4, the accelerating section 23 includes an electrode 18, an extracting power supply 21, an accelerating power supply 22, and a decelerating power supply 32. The electrode 18 includes first, second, third and fourth electrodes 18a, 18b, 18c and 18d, which are all provided around the opening of the arc chamber 30. The first electrode 18a is located closest to the opening of the arc chamber 30 and the extracting power supply 21 is connected between the first electrode 18a and the arc electrode 17.

Figure 4:
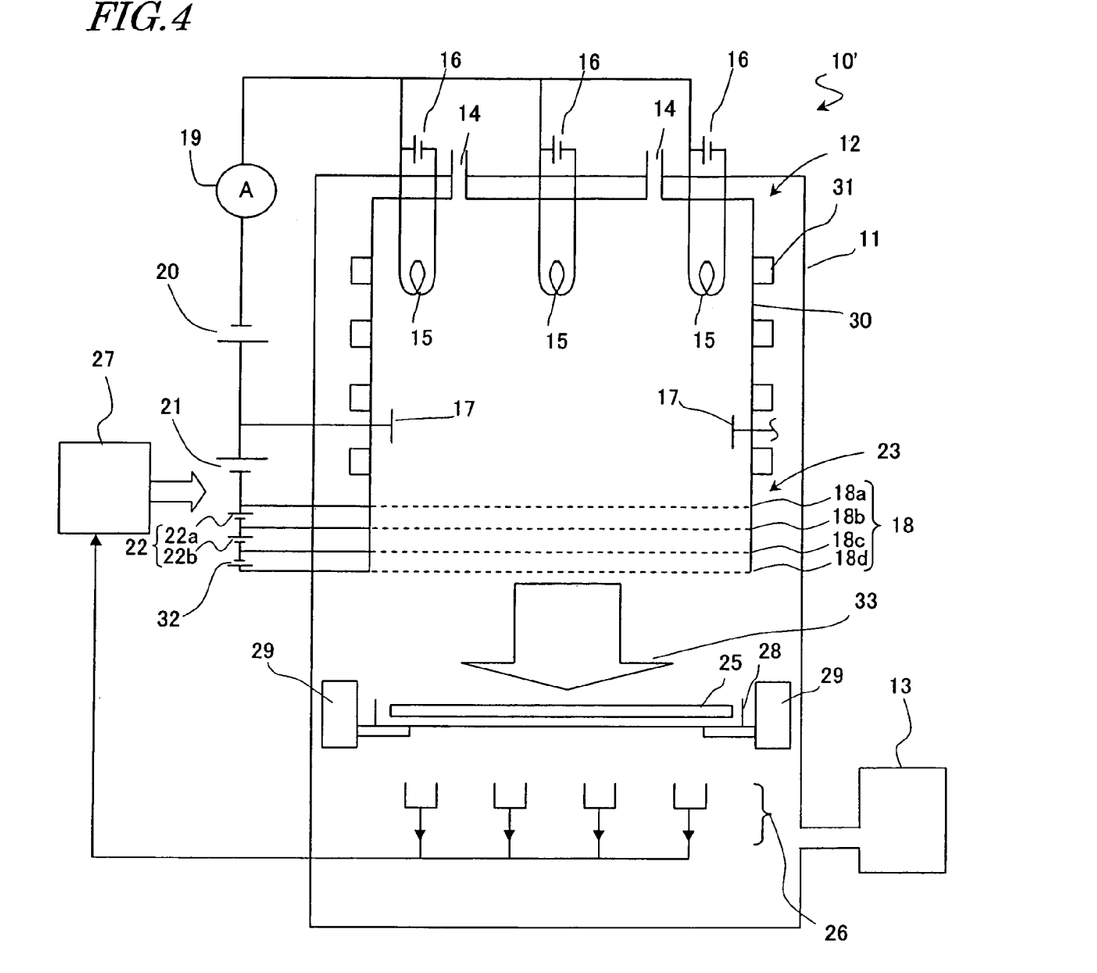
FIG. 4 is a schematic representation illustrating another preferred embodiment of an ion doping system according to the present invention.

A power supply 22a is connected between the first and second electrodes 18a and 18b and another power supply 22b is connected between the second and third electrodes 18b and 18c. And the decelerating power supply 32 is connected between the third and fourth electrodes 18c and 18d. The power supply 22a applies a voltage to extract ions, generated in the ion source 12, between the first and second electrodes 18a and 18b. On the other hand, the power supply 22b applies a voltage to accelerate the extracted ions between the second and third electrodes 18b and 18c. In this case, the sum of the voltages applied by the power supplies 22a and 22b is generally called an "accelerating voltage". Meanwhile, the decelerating power supply 32 prevents secondary electron ions, generated by the ions that have collided against, or been implanted into, the substrate 25, from being accelerated by the accelerating section 23 toward the ion source 12.

Optionally, as shown in FIG. 4, a shifting mechanism 29 for shifting the substrate holder 28 may also be provided for the ion doping system and may shift the substrate 25 such that the ion beam 33 scans the substrate 25.

INDUSTRIAL APPLICABILITY

According to the present invention, an ion doping system, which can minimize the variation in the ratio of ion species generated and realizes a higher degree of controllability, can be provided. This ion doping system can be used particularly effectively to make a semiconductor device with a large area as a display device, for example. In addition, according to the present invention, a semiconductor device that hardly exhibits variations in device characteristics within the substrate plane can be provided. Such a semiconductor device can be used in various applications and is particularly effectively applicable to make a semiconductor device with a large area as a display device, for example.

The invention claimed is:

1. An ion doping system comprising:
a chamber;
an exhausting section for exhausting gases from the chamber;
an ion source, which is provided for the chamber, includes an inlet port to introduce a gas including a dopant element, a filament emitting thermo electrons, and an anode electrode to produce an arc discharge between the filament and the anode electrode, and decomposes the gas through the arc discharge, thereby generating a plurality of ion species including the dopant element; and
an accelerating section for extracting the plurality of ion species, generated in the ion source, from the ion source and accelerating the plurality of ion species toward a target,
wherein the ion doping system controls the arc discharge such that a generation ratio of the plurality of ion species is kept constant in the ion source by maintaining an amount of arc current between the filament and the anode electrode at a constant value, while allowing a current density of an ion beam to change.

2. The ion doping system of claim 1, further comprising:
a filament power supply for applying a voltage to the filament; and
an arc power supply for applying a voltage between the filament and the anode electrode,
wherein the ion doping system controls the filament power supply and/or the arc power supply such that a constant amount of arc current flows between the filament and the anode electrode.

3. The ion doping system of claim 2, further comprising an ammeter for measuring the arc current,
wherein the ion doping system controls the output voltage of the arc power supply such that the arc current measured with the ammeter has a constant value.

4. The ion doping system of claim 1, wherein a plurality of ions species are produced at a constant ratio from the gas as a result of the arc discharge.

5. A semiconductor device comprising:
a substrate with an insulating surface; and
a crystalline silicon film provided on the substrate, wherein
the semiconductor device includes a plurality of semiconductor components, in each of which source, drain and channel regions are defined in the crystalline silicon film by introducing the dopant element as an impurity into the crystalline silicon film using the ion doping system of claim 1.

6. The semiconductor device of claim 5, wherein the semiconductor device satisfies the inequality $0.05 \geq 3\sigma/\text{Ave}$, where Ave is the average of dopant concentrations in the respective channel regions of the semiconductor components and $\sigma$ is the standard deviation thereof.

7. The semiconductor, device of claim 5, wherein the semiconductor device satisfies the inequality $0.05 \geq 3\sigma/\text{Ave}$, where Ave is the average of dopant concentrations in the respective source/drain regions of the semiconductor components and $\sigma$ is the standard deviation thereof.

8. The semiconductor device of claim 5, wherein the crystalline silicon film has been crystallized with a catalyst element that promotes the degree of crystallinity of an amorphous silicon film.

9. The semiconductor device of claim 8, wherein the amorphous silicon film has a thickness of 25 nm to 80 nm.

10. The semiconductor device of claim 8, wherein the crystalline silicon film has the catalyst element at a concentration of $1 \times 10^{16}$ atoms/cm$^3$ or less.

11. The semiconductor device of claim 8, wherein the catalyst element is at least one element selected from the group consisting of nickel, cobalt, palladium, platinum, copper, silver, gold, indium, tin, aluminum and antimony.

12. The semiconductor device of claim 8, wherein the catalyst element is nickel.

13. The semiconductor device of claim 8, wherein the crystalline silicon film has been formed by carrying out at least one of a furnace heating process, a lamp annealing process and a laser radiation process after the catalyst element has been introduced.

14. An ion doping method comprising the steps of:
decomposing a gas, including a dopant element, through an arc discharge and generating a plurality of ion species; and
accelerating the plurality of ion species with a predetermined voltage, thereby bombarding a target with the plurality of ion species,
wherein the step of decomposing includes controlling the arc discharge such that a generation ratio of the plurality of ion species is kept constant by maintaining an amount of current by the arc discharge at a value, while allowing a current density of an ion beam to change.

15. The ion doping method of claim 14, wherein the dopant element is boron or phosphorus.

16. A method for fabricating a semiconductor device, the method comprising the steps of:
(A) forming an amorphous silicon film on a substrate with an insulating surface;
(B) adding a catalyst element to the amorphous silicon film;
(C) thermally treating and crystallizing the amorphous silicon film, to which the catalyst element has been added, thereby turning the amorphous silicon film into a crystalline silicon film;

(D) generating an arc discharge that produces a constant amount of arc current while allowing a current density of an ion beam to change, thereby decomposing a gas including an impurity element and accelerating, and introducing into the crystalline silicon film, a plurality of ion species that have been generated at a constant generation ratio as a result of the decomposition; and (E) thermally treating the crystalline silicon film.

17. The method of claim 16, further comprising the step of forming an insulating film on the crystalline silicon film after the step (C) has been performed, wherein the step (D) includes the steps of:

(D1) generating the arc discharge that produces the constant amount of arc current, thereby decomposing the gas including the impurity element and accelerating, and introducing into the crystalline silicon film by way of the insulating film, the plurality of ion species that have been generated as a result of the decomposition;

(D2) making a pattern of a conductive material on the crystalline silicon film; and (D3) generating the arc discharge that produces the constant amount of arc current, thereby decomposing the gas including the impurity element and accelerating, and introducing into the crystalline silicon film using the pattern as a mask, the plurality of ion species that have been generated as a result of the decomposition.

18. The method of claim 17, wherein the impurity element in the step (D1) is boron and the impurity element in the step (D3) is phosphorus.

19. The method of claim 16, wherein the catalyst element is at least one element selected from the group consisting of nickel, cobalt, palladium, platinum, copper, silver, gold, indium, tin, aluminum and antimony.

* * * * *